United States Patent

Chrysler et al.

[11] Patent Number: 5,604,665
[45] Date of Patent: Feb. 18, 1997

[54] MULTIPLE PARALLEL IMPINGEMENT FLOW COOLING WITH TUNING

[75] Inventors: Gregory M. Chrysler; Richard C. Chu, both of Poughkeepsie; Richard M. Koenig, Gardiner, all of N.Y.

[73] Assignee: International Business Machines Corporation, Armonk, N.Y.

[21] Appl. No.: 497,579

[22] Filed: Jun. 30, 1995

[51] Int. Cl.$^6$ .................................................. H05K 7/20
[52] U.S. Cl. ........................ 361/703; 165/908; 257/722; 277/226; 361/719
[58] Field of Search .................................. 415/115, 116; 60/752–760; 257/712, 713, 721, 722, 723, 724; 174/16.1, 16.3; 277/178, 226; 165/80.3, 122, 126, 185, 104.27, 104.32, 104.33, 104.34, 908; 62/384, 385, 438, 259.2, 413–419; 361/690–693, 702, 703, 704, 716–719

[56] References Cited

U.S. PATENT DOCUMENTS

| | | |
|---|---|---|
| 3,843,910 | 10/1974 | Ringuet . |
| 4,044,515 | 8/1977 | Hollingsead ............................ 52/173 R |
| 4,186,945 | 2/1980 | Hahn ........................................ 285/19 |
| 4,277,816 | 7/1981 | Dunn et al. . |
| 4,291,364 | 9/1981 | Andros et al. . |
| 4,296,455 | 10/1981 | Leaycraft et al. . |
| 5,025,856 | 6/1991 | VanDyke et al. . |
| 5,063,476 | 11/1991 | Hamadab et al. . |
| 5,083,194 | 1/1992 | Bartilson . |
| 5,170,320 | 12/1992 | Pease ....................................... 361/383 |
| 5,190,241 | 3/1993 | Pease ....................................... 244/1 R |
| 5,196,989 | 3/1993 | Zsolnay . |
| 5,315,479 | 5/1994 | Bartilson ................................. 361/690 |
| 5,316,075 | 5/1994 | Quon ....................................... 165/80.4 |
| 5,363,654 | 11/1994 | Lee ............................................. 60/752 |
| 5,435,381 | 7/1995 | Downing .................................. 165/110 |
| 5,467,815 | 11/1995 | Haumann ............................... 165/109.1 |

OTHER PUBLICATIONS

Eid, J. C., et al., *Impingement Cooling Board (ICB)*, Research Disclosure (33058), Kenneth Mason Publications Ltd., England, Oct., 1991, No. 330, PO889-0346. 1 page.
Doo, V. Y., et al., *IBM Technical Disclosure Bulletin*, "High Performance Package for Memory," vol. 21, No. 2, Jul. 1978, pp. 585–586.

*Primary Examiner*—Gerald P. Tolin
*Attorney, Agent, or Firm*—Lawrence D. Cutter

[57] ABSTRACT

An integrated coolant fluid supply and exhaust distribution pathdefining structure is employed to provide a substantially planar cooling system for an electronic assembly which includes a substrate having electronic modules or electronic chips disposed thereon. The pathdefining structure includes interleaved supply and exhaust channels with the supply channels including apertures disposed adjacent to heat sink shafts which are connected to planar heat sink structures in thermal contact with chips or modules being cooled. The pathdefining structure produces a fluid flow path which is initially aligned with the surface area enhancing heat sink shafts and which exits therefrom in a plurality of directions which ultimately lead to the exhaust channels provided in the path-defining structure. The assembly, which includes an exterior housing and the substrate, provides a compact cooling mechanism for electronic components. The cooling structure is both compact and permits high density placement of electronic chips or modules. The system is particularly adaptable in that it permits fine tuning of fluid flow to various ones of the chips or modules and stacking of the assemblies themselves.

16 Claims, 5 Drawing Sheets

MULTIPLE PARALLEL IMPINGEMENT FLOW COOLING WITH TUNING

BACKGROUND OF THE INVENTION

The present invention is generally directed to impingement flow cooling of electronic modules and chips. More particularly, the present invention is directed to a planar configuration of supply and exhaust channels which permits tunable cooling and which furthermore permits chips and modules to be packed densely in adjacent or nearly adjacent patterns.

Modern electronic circuit chips are consuming ever larger mounts of electrical power. Because of the desire to operate these circuits at increased frequencies, there is a concomitant increase in the power dissipated by these chips. Similarly, because of the same desire for speed and also because of the desire to achieve physical compactness, more and more circuits are being placed on electronic chip devices. Accordingly, it is seen that there is an ever increasing rise in the power dissipation associated with these chips, as measured in watts per square centimeter (power per unit area). Accordingly, it is seen that there is a decided need to be able to cool not just individual chips but also assemblies of electronic chips.

These electronic circuit chips may be disposed directly on a printed circuit board and may from time to time employ heat sink devices which assist in removal of heat from the electronic chip. Additionally, it is noted that electronic chips may be disposed on intermediate substrates to produce what is typically referred to as multi-chip modules. Whether disposed on an intermediate substrate or directly on a circuit board, the cooling problems associated with assemblies of these electronic devices remain the same. The discussions herein therefore with respect to integrated circuit chips are also directly applicable to an alternate embodiment employing multi-chip modules.

As indicated above, modern electronic circuit chips and their associated high-density packaging configurations not only require significant cooling, but, in keeping with the desire for overall compactness, it is desirable to be able to provide a cooling assembly or cooling unit which likewise takes up as low a volume as possible and which is disposable in the same overall planar configuration employed for circuit boards and/or circuit modules.

Additionally, it is noted that a greater variety of chips are disposed on printed circuit boards or on multi-chip module substrates, there can be a wide disparity in the power/cooling requirements for these chips. In particular, it is noted that certain chips might in fact run hot while others may run decidedly cooler because of the large variety of chip functions which must coexist on a single backplane. Accordingly, it is therefore desirable to provide a readily manufacturable and usable mechanism for tuning a cooling system so as to provide maximum cooling for those chips having the greatest cooling needs in terms of thermal power density.

As an illustration of the great challenges associated with cooling electronic devices, it is noted that it is anticipated that by the year 2000 the thermal power density associated with operating electronic circuit chips, as measured in watts per square centimeter, will have substantially increased. Accordingly, it is seen that the cooling of electronic chip devices is a non-trivial problem.

SUMMARY OF THE INVENTION

In accordance with a preferred embodiment of the present invention an integrated coolant fluid supply and exhaust distribution path defining structure is employed. This structure is substantially planar and includes interleaved supply and exhaust channels. The supply channels include apertures therein which are disposed adjacent to heat sink structures attached to electronic modules or electronic chips which are to be cooled. These apertures preferably admit cooling fluid in a direction substantially parallel to surface area enhancing shafts (or fins) which extend from a heat sink structure. Subsequently, the coolant fluid, preferably air, passes over the thermal heat sink shafts and exits in a direction substantially perpendicular to that which it entered at, that is, in a direction substantially parallel to the face of the heat sink. Subsequent to passage through the heat sink structure, the coolant fluid enters the above-mentioned interleaved exhaust channels through which it is directed away from the circuits being cooled. In preferable embodiments of the present invention, the path defining structure, together with an exterior housing and the substrate upon which the chips and modules are disposed together define a closed coolant fluid flow path.

The path defining structure of the present invention is essentially employed to define a coolant flow manifold which includes both supply and exhaust plenums or channels. The path defining structure, while not quite describable as a manifold in and of itself, defines the essential fluid flow path. The planarity of this path defining structure permits the cooling system aspects of the resultant electronic assembly to be configured in a minimal volume which is consistent with the shape and packaging properties of the substrate which possesses the chips or modules being cooled. The resulting structure and the variations thereof described herein exhibit a number of advantages several of which are indicated in the list of objects presented below.

Accordingly, it is an object of the present invention to provide a system and method for cooling electronic chips and modules.

It is also an object of the present invention to provide an adjunct cooling system for an electronic substrate which exhibits the same planar configuration as the substrate itself and which also adds only minimally to the height of the overall structure.

It is yet another object of the present invention to provide an air-cooling mechanism for integrated circuit chips and modules.

It is a still further object of the present invention to provide a cooling system for electronic components which can be cooled in a tunable manner so that those devices exhibiting greater power dissipation needs are provided with a greater degree of cooling capacity.

It is still another object of the present invention to provide a cooling system structure which is capable of providing electromagnetic radiation shield properties.

It is a still further object of the present invention to provide a cooling structure for integrated circuit chip devices and modules in which there is a balanced flow of cooling fluid.

It is even another object of the present invention to provide a coolant flow system in which the exhaust volume is greater than the inlet volume so as to more evenly balance pressure drop occurring through the cooling system.

It is yet another object of the present invention to provide a cooling system for electronic chips and modules which permits these chips and modules to be disposed in adjacent or near adjacent configurations.

It is a still further object of the present invention to provide a coolant flow system in which the same type and degree of flow may be provided to all of the components being cooled.

It is also an object of the present invention to provide a coolant distribution system which is readily manufacturable either from molded or stamped parts.

It is a still further object of the present invention to provide a compact coolant flow distribution system.

Lastly, but not limited hereto, it is an object of the present invention to be able to improve the performance speed and reliability of electronic circuit components, particularly those found in computing systems.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
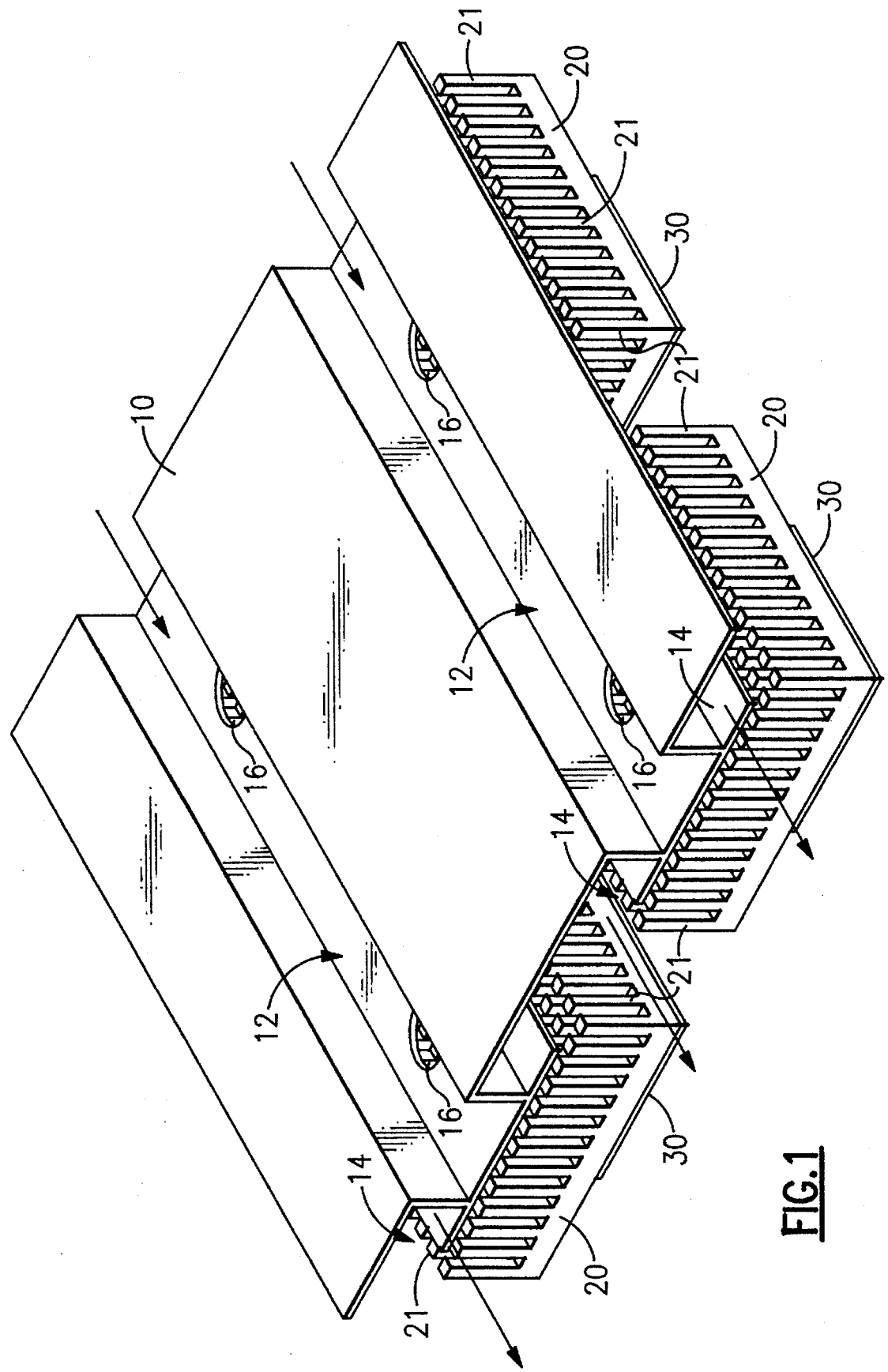
FIG. 1 is an isometric view illustrating all of the components of a coolant flow system in accordance with the embodiment of the present invention (except for an exterior housing) which is most desirable for very high planar packing density.

Except for a surrounding housing (which is typically a rectangular box), the embodiment shown in FIG. 1 illustrates the essential features of the present invention. In particular, there are shown electronic chips or modules 30 which are to be cooled. These devices are shown in contact with heat sinks which include planar portions 20 and "a forest" of shafts 21 extending substantially perpendicular to planar portion 20. These heat sinks, having portions 20 and 21 preferably, comprise a highly thermally conductive material such as a metal like aluminum. Shafts 21 extending from planar portions 20 essentially provide surface area enhancement for fluid flow between the shafts.

An essential aspect of FIG. 1 is path-defining structure 10 which includes interleaved supply channels 12 and exhaust channels 14. Supply channels 12 include apertures 16 which are disposed adjacent to heat sink shafts 21. Thus, coolant fluid, such as air, entering supply channel 12 passes through aperture 16 onto a heat sink structure. It initially passes through the heat sink in a direction substantially aligned with shafts 21. Subsequently, however, coolant fluid emerges from the heat sink structure in a plurality of different directions and enters exhaust channel 14. A surrounding housing (visible in FIGS. 2 and 3) provides the structure for the indicated closed fluid flow paths.

Heat sink shafts 21 are not limited to the specific structure shown. In particular, shafts 21 may comprise any surface area enhancing structure which is a useful thermal conductor. In particular, "shafts" 21 may actually comprise parallel plate fins or even fins disposed radially. Likewise, the cross-section of the shafts are not limited to square, rectangular or circular designs. Additionally, it is noted that in lower power designs, the heat sink structure is optional. In such cases, coolant fluid flow impinges directly on the electronic component being cooled.

The above-described structure exhibits a number of decided advantages. In particular, it is seen that chips or modules 30 may be disposed as closely adjacent to one another as is practical. In point of fact, apart from issues with respect to connecting chips or modules 30 electrically to a substrate, there is nothing which prevents disposing these devices in an immediate adjacent relationship with one another.

Because of the large number of different packaging densities that may be accommodated by the present invention, it is seen that apertures 16 may be selected to be of a size, dimension, spacing and configuration appropriate to the degree of cooling required by the module or chip which is disposed immediately below the aperture(s).

In preferred embodiments of the present invention, path-defining structure 10 comprises a material such as aluminum. The use of aluminum for this structure is advantageous in that it is lightweight, highly thermally conductive, and easily manufacturable, such as by extrusion methods. Furthermore, aluminum is easily machinable and the size of aperture 16 may be controlled and/or determined after manufacture of the base structure. However, in preferred embodiments of the present invention the size of impingement apertures 16 are controlled by the insertion therein of flow restriction devices such as appropriately sized grommets (see reference numeral 17 in FIG. 4). The use of flow restriction devices and/or the individual sizing of apertures 16 may be employed to achieve desired degrees of individualized cooling capabilities for different ones of the chips or modules.

The structure illustrated in FIG. 1 is also advantageous from a thermodynamic viewpoint. In particular, it is generally desirable to provide as large a volume of fluid flow through a cooling system as is possible. This is generally limited by the power capacity of the coolant fluid flow drive mechanism (fan, blower, or compressor). Thus, a low overall fluid flow resistance is desired to achieve the greatest volume of fluid flow for any given pump or fan power level. Nonetheless, in order to achieve the greatest degree of cooling, it is desirable to provide a system in which the pressure drop occurs in an area of the system flow in which the pressure drop "does the most good". Accordingly, in the system illustrated in FIG. 1 it is preferable to employ exhaust channels 14 which are larger than supply channels 12. This permits a more balanced flow without producing excessive pressure drops in either the supply or exhaust channels. In particular, most of the pressure drop occurs within the "forest" of heat sink projections 21 and apertures 16.

Depending upon the level of thermal energy which must be dissipated from chips or modules 30, it is possible to employ a plastic, particularly a high temperature plastic material, such as a polycarbonate, as the material of choice for path-defining structure 10. In such cases, the sizes of apertures 16 may be determined in a plastic mold for the structure or may be later determined either by machining operations or by the inclusion of selected flow restriction devices, such as grommets, in the apertures. In the event that a plastic path-defining structure is employed, it is desirable to dispose therein metal wires, a metal grid, or electrically conductive particulate matter to provide any necessary or desirable electromagnetic shielding. Nonetheless, the shielding may also be provided by an appropriately designed exterior housing which itself may comprise either an electrically conductive material or a plastic material containing electrically conductive components.

Figure 2:
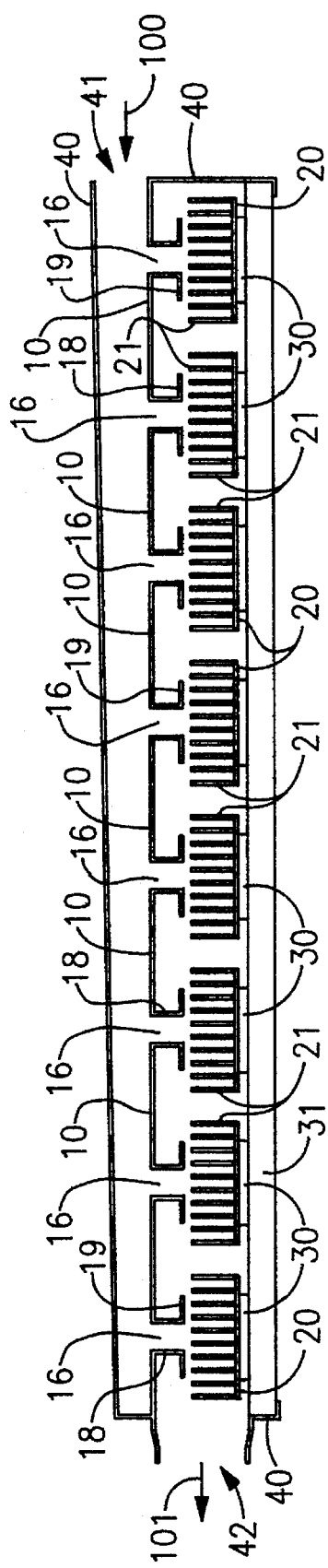
FIG. 2 is a cross-sectional side elevation view illustrating one embodiment of the present invention in which the supply and exhaust inlets are disposed on opposite edges of the substrate being cooled and which also illustrates the coolant supply flow and the coolant exhaust flow in different planes.
Figure 3:
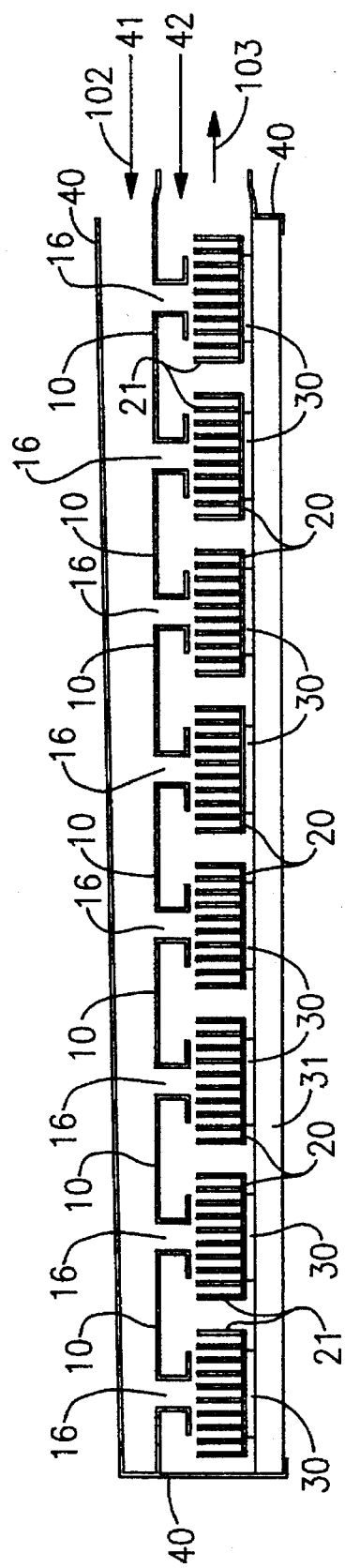
FIG. 3 is a view similar to that shown in FIG. 2 except that it more particularly illustrates the situation in which the supply inlet and the exhaust outlet are disposed on the same edge of the substrate being cooled.

FIG. 2 illustrates an alternate embodiment of the present invention in which it is particularly seen that the coolant fluid exits from an edge of the assembly opposite to that from which it enters. In particular, it is seen from flow direction arrow 100 that the fluid enters at inlet 41 and exits at outlet 42 as further indicated by flow direction arrow 101. Additionally, it is seen that the upper portion of housing 40 is somewhat sloped so as to provide a more balanced coolant flow through impingement orifices 16 which are here shown as including optional shrouds 19 extending outwardly from the bottoms of impingement tubes 18 (see also more particularly FIG. 6, which are also optional but are required for shrouds 19). FIG. 3 is similar to FIG. 2 except that it illustrates a particular embodiment in which the coolant fluid exits the assembly from the same edge which it enters. This is particularly illustrated by flow direction arrows 102 and 103 associated with coolant inlet 41 and coolant outlet 42 respectively. FIG. 3 is a preferable embodiment when it is desired to have coolant fluid connections only on one side of the assembly.

Figure 4:
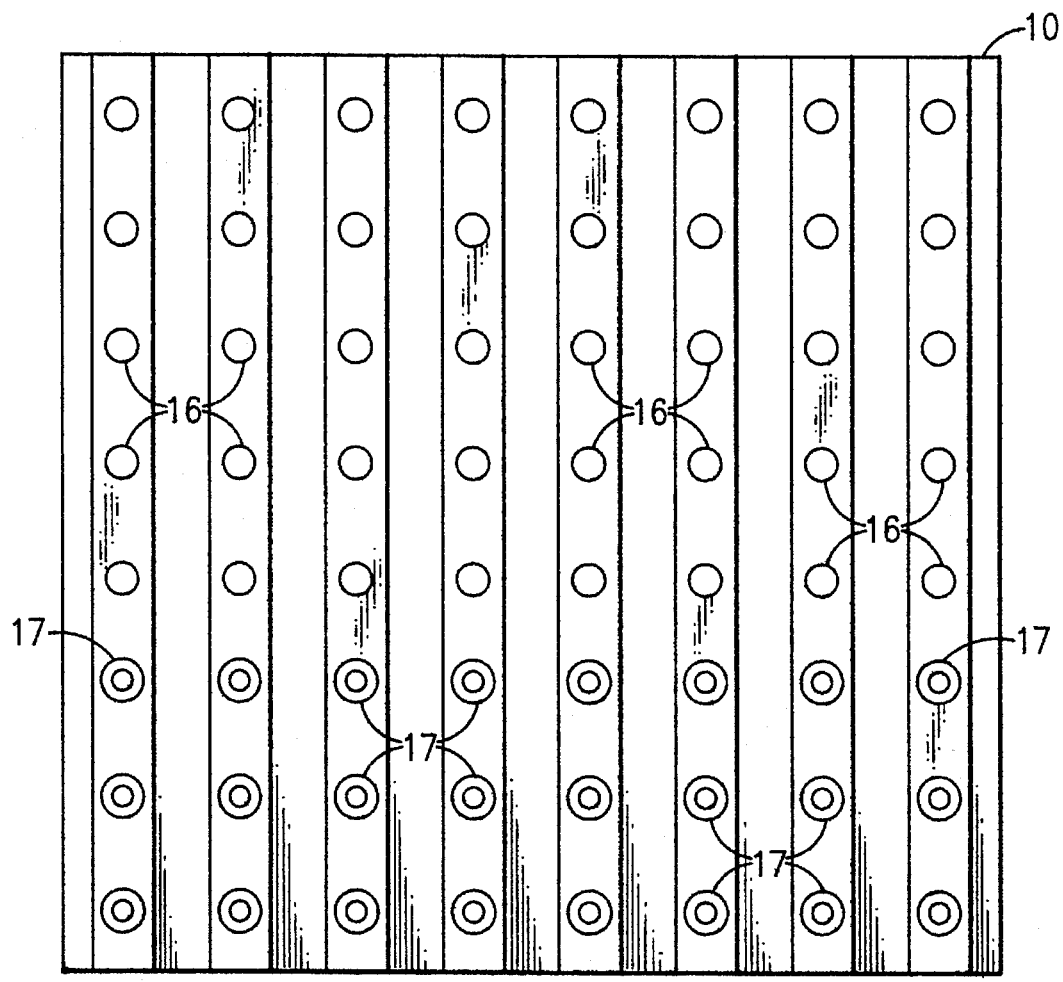
FIGS. 4 and 4A are top and end views of a path defining structure in accordance with the present invention in which coolant flow restriction devices are employed to more particularly control coolant flow to various ones of the chips or modules being cooled so as to therefore make the overall system tunable.
Figure 4A:
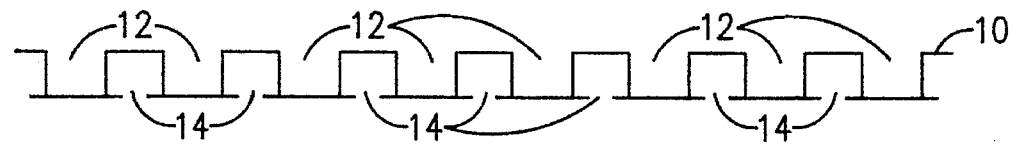
Figure 5:
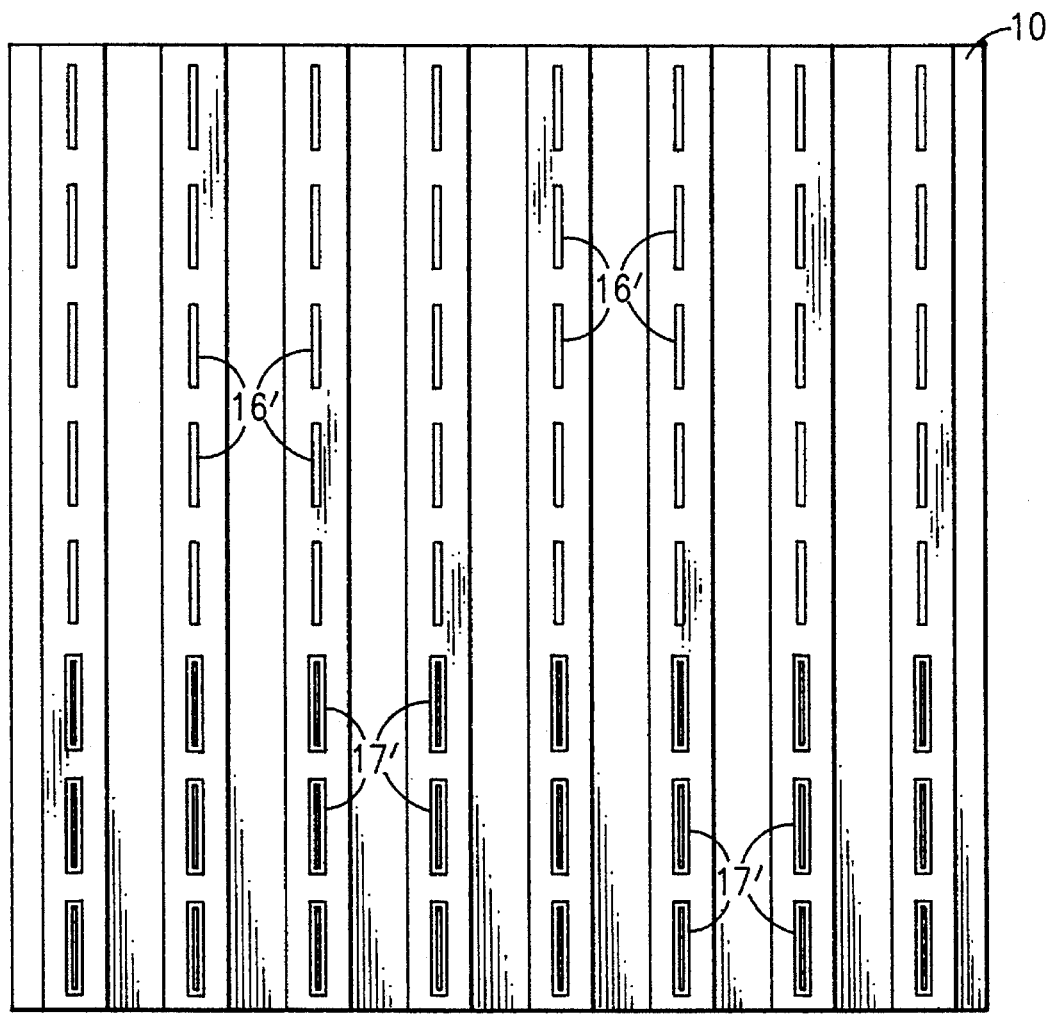
FIGS. 5 and 5A are views similar to FIG. 4 except that rectangular as opposed to circular slots are shown.
Figure 5A:
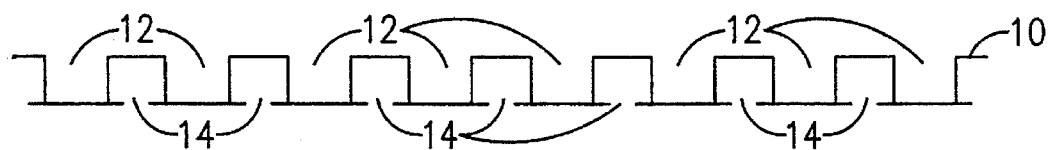

In accordance with the desire to be able to conveniently control the flow of coolant fluid to various ones of the chips or modules, it is seen that it is possible to deploy grommets 17 within orifices 16, as shown in FIG. 4. These grommets may be all be of the same size or they may be selectively chosen in dependence on the thermal load of the chips or modules with which they are associated. Similarly, it is seen that the shape of the impingement orifice is not necessarily circular. In particular, FIG. 5 illustrates rectangular orifices 16' together with flow control grommets 17' which may be inserted therewith for flow restriction purposes. Rectangular orifices are particularly useful in conjunction with parallel plate heat sinks. Circular orifices are useful in conjunction with heat sinks having fins disposed in a radial pattern.

It is seen that the configuration shown in FIGS. 1–5 above eliminates a serious problem that exists in many cooling designs. In particular, in those designs in which air or other cooling fluid is passed over a heat sink from one direction and exits in another direction, the fluid picks up heat as it traverses each heat sink. Each subsequent row of modules therefore is cooled by warmer and warmer cooling fluid. Thus, the second row of modules will not be cooled as well as the first nor will the third row be cooled as well as the second. This results in each row of modules operating at higher and higher temperatures. The total coolant flow rate chosen is usually determined by the cooling requirements that are associated with the last row of modules so that it is cooled to its desired temperature, considering the elevated thermal heat sink temperatures that have been previously experienced by the coolant flow as described above. This over-cooling approach to system design particularly requires much more coolant flow than would otherwise be required if all the modules received air at that temperature. The higher air flow rate required by this design also adds to other problems in the electronic system, for example: increased requirements for the higher flow rate; higher pressure drop brought about by the increased air flow rate; and increased noise associated with the increased air flow rate and pressure drop. The present design, however, eliminates these problems. By using the highly parallel flow pattern illustrated in the present system, the problem of certain modules or chips receiving heated air is eliminated. All modules or chips therefore operate at the lowest possible temperature, which is dependent on the module power and inlet air temperature, but not on the position that the module or chip occupies on its card or substrate. The airflow rate can therefore be set at a lower value since there is no preheating of the cooling air. This results in lower acoustic emissions and lower blower or pumping power requirements. Also, the operating temperature of all modules or chips are more nearly the same than with standard cross flow approaches.

Figure 6:
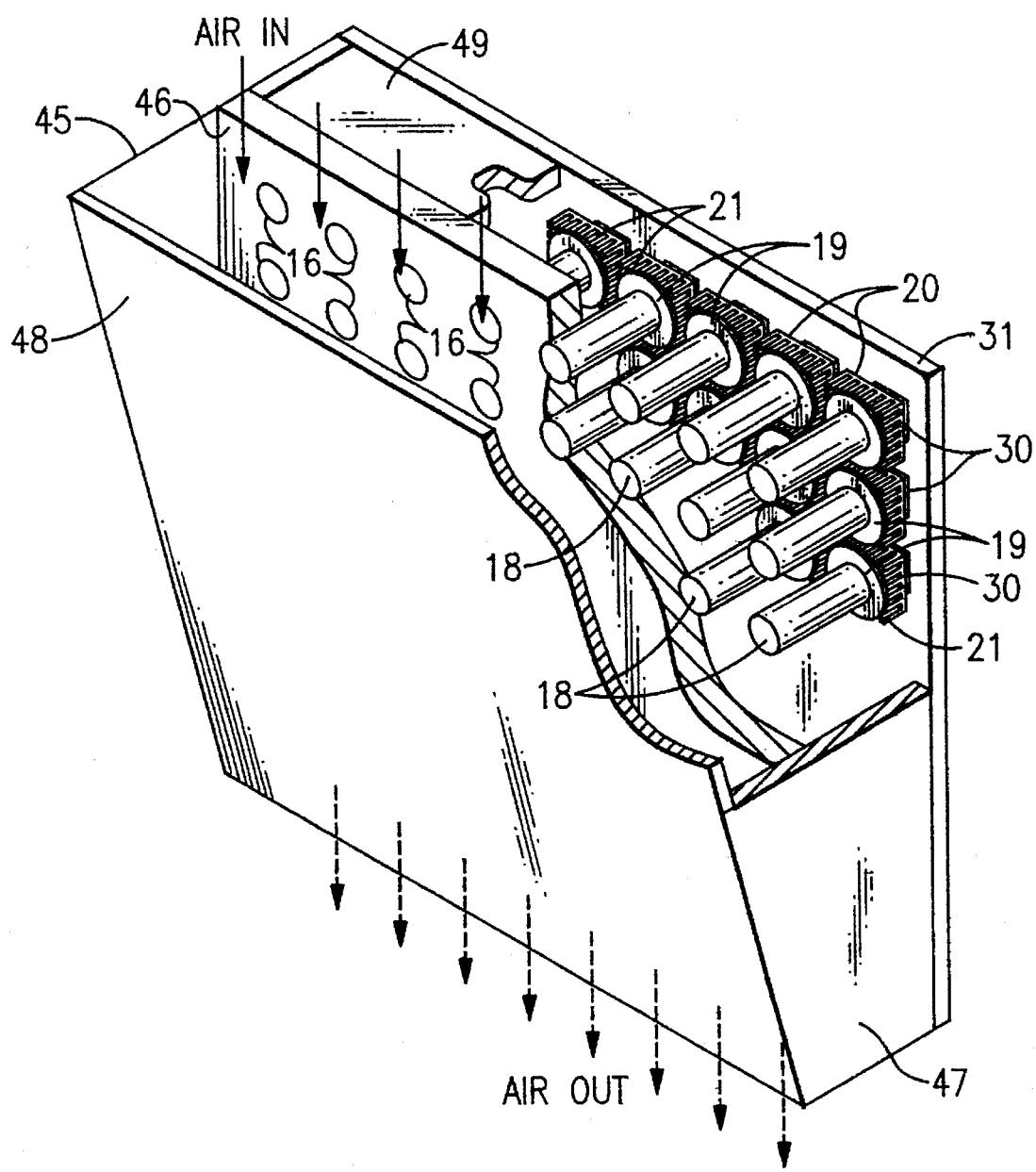
FIG. 6 is an isometric view illustrating an alternative embodiment of the present invention.

FIG. 6 illustrates another embodiment of the present invention which also implements a highly parallel tunable impingement coolant fluid flow design. In the embodiment shown in FIG. 6, a coolant flow path is defined at least in part by an exterior housing having side walls 47, sloped top wall 48, and rear wall 49. The bottom wall of the housing may be a separately provided structure or it may comprise substrate 31. The interior of the housing in FIG. 6 is divided into two parts by flow path-defining structure or divider 46 which includes impingement orifices 16 into which are inserted impingement or directing tubes 18 the bottoms of which preferably include shrouds 19 to better disperse the flow of coolant fluid through heat sink projections 21. In the design illustrated in FIG. 6 air or other coolant fluid enters the top of structure and exits from the bottom. In this design, the exhaust portion is preferably of a larger volume than the supply portion, which also is preferably tapered as shown. Nonetheless, the objectives of a highly parallel tunable impingement flow cooling scheme are still achieved.

From the above, it should be appreciated that the coolant fluid flow assemblies shown in FIGS. 1–6 achieve all of the objectives specified above. In particular, the resultant structure is efficient, compact, planar, tunable, and easily manufacturable and adjustable. In addition, in those circumstances where the power levels permit it, the coolant distribution system may be operated without the inclusion of the heat sinks.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A fluid cooled electronic assembly comprising:

an exterior housing;

a substrate having electronic components disposed thereon, said substrate being disposed within said housing;

a plurality of heat sinks disposed in thermal contact with said electronic components, said heat sinks including a plurality of surface area enhancing projections extending therefrom, said projections permitting introduction therebetween of a coolant fluid in a direction substantially aligned with said projections, while also permitting exit of said coolant fluid in directions substantially perpendicular to said projections; and an integrated coolant fluid supply and exhaust distribution path-defining structure, said path-defining structure being in the form of a substantially flat unitary single piece slab having a plurality of interleaved supply and exhaust channels disposed therein in side-by-side alternation, said supply channels including apertures disposed therein aligned with said heat sink projections, said exhaust channels being open to receive coolant fluid flow subsequent to its passage through said heat sink projections, and wherein said housing, said substrate, and said path-defining structure defining a closed fluid flow path.

2. The assembly of claim 1 further including at least one flow restriction device disposed within one of said apertures.

3. The fluid cooled assembly of claim 1 in which said closed fluid flow path is such that coolant fluid exits from said closed path on the opposite edge of said assembly from which it entered.

4. The fluid cooled assembly of claim 1 in which said closed fluid flow path is such that coolant fluid exits from said closed path on the same edge of said assembly from which it entered.

5. The fluid cooled assembly of claim 1 in which said housing possesses a sloped side so that, in conjunction with said pathdefining structure, the inlet supply path is narrowed in the direction of coolant fluid flow.

6. The fluid cooled assembly of claim 1 in which said housing is made of an electrically conductive material.

7. The fluid cooled assembly of claim 1 in which said housing is plastic.

8. The fluid cooled assembly of claim 7 in which said plastic includes electrically conductive material disposed therein, whereby electromagnetic shielding is provided.

9. The fluid cooled assembly of claim 1 in which said pathdefining structure is made of a material selected from the group consisting of aluminum and plastic.

10. The fluid cooled assembly of claim 1 in which said exhaust channels in said pathdefining structure are larger in volume than the supply channels therein.

11. The fluid cooled assembly of claim 1 in which said electronic components are disposed substantially adjacent to one another.

12. The fluid cooled assembly of claim 1 in which said heat sinks include a planar portion in contact with said modules or chips.

13. The fluid cooled assembly of claim 12 in which said projections extend from said heat sink portions in a direction substantially perpendicular to said planar portion.

14. The fluid cooled assembly of claim 13 in which said projections exhibit the same height for each heat sink.

15. The fluid cooled assembly of claim 1 in which said apertures are circular.

16. The fluid cooled assembly of claim 1 in which said apertures are rectangular.

* * * * *